United States Patent
Tate et al.

(10) Patent No.: US 11,621,048 B2
(45) Date of Patent: Apr. 4, 2023

(54) POSITIONING READ THRESHOLDS IN A NONVOLATILE MEMORY BASED ON SUCCESSFUL DECODING

(71) Applicant: APPLE INC., Cupertino, CA (US)

(72) Inventors: Yonathan Tate, Kfar Saba (IL); Ilia Benkovitch, Rishon Lezion (IL); Michael Jeffet, Tel Aviv (IL); Nir Tishbi, Kfar Saba (IL); Roy Roth, Tel Aviv (IL); Ruby Mizrahi, Tel Mond (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/388,048

(22) Filed: Jul. 29, 2021

(65) Prior Publication Data
US 2023/0031584 A1    Feb. 2, 2023

(51) Int. Cl.
| | | |
|---|---|---|
| G11C 29/42 | (2006.01) | |
| G11C 29/44 | (2006.01) | |
| H03M 13/29 | (2006.01) | |
| G11C 16/26 | (2006.01) | |
| G11C 16/10 | (2006.01) | |

(52) U.S. Cl.
CPC ............ *G11C 29/42* (2013.01); *G11C 16/102* (2013.01); *G11C 16/26* (2013.01); *G11C 29/4401* (2013.01); *H03M 13/2948* (2013.01)

(58) Field of Classification Search
CPC ....... G11C 29/42; G11C 16/102; G11C 16/26; G11C 29/4401
See application file for complete search history.

(56) References Cited

U.S. PATENT DOCUMENTS

| | | |
|---|---|---|
| 8,145,984 B2 | 3/2012 | Sommer et al. |
| 8,374,026 B2 | 2/2013 | Sharon et al. |
| 8,482,978 B1 | 7/2013 | Perlmutter et al. |
| 8,547,740 B2 | 10/2013 | Sommer et al. |
| 8,665,650 B2 * | 3/2014 | Yang ............... G11C 16/26 365/210.1 |
| 8,990,665 B1 | 3/2015 | Steiner et al. |
| 9,153,336 B1 * | 10/2015 | Yang ............... G11C 16/3422 |
| 9,318,215 B2 | 4/2016 | Desireddi et al. |
| 10,790,860 B2 | 9/2020 | Ismail et al. |
| 10,884,855 B1 | 1/2021 | Yazovitsky et al. |
| 11,217,319 B2 * | 1/2022 | Zhang ............... G11C 16/349 |
| 2014/0281767 A1 | 9/2014 | Alhussien et al. |

* cited by examiner

*Primary Examiner* — Vanthu T Nguyen
(74) *Attorney, Agent, or Firm* — Kligler & Associates Patent Attorneys Ltd

(57) ABSTRACT

A memory controller includes an interface and a processor. The interface communicates with a plurality of memory cells, and an individual one of the plurality of memory cells stores data in multiple predefined programming levels. The processor is configured to read an Error Correction Code (ECC) code word from a group of memory cells, via the interface, using multiple read thresholds positioned between adjacent programming levels, for producing multiple readouts that contain respective numbers of errors, to derive from the code word a reference readout that contains no errors, or contains a number of errors smaller than in the code word, to calculate multiple distances between the reference readout and the respective readouts, and set a preferred read threshold based on the calculated distances, and to perform subsequent read operations for retrieving data from the plurality of memory cells, using the preferred read threshold.

19 Claims, 5 Drawing Sheets

POSITIONING READ THRESHOLDS IN A NONVOLATILE MEMORY BASED ON SUCCESSFUL DECODING

TECHNICAL FIELD

Embodiments described herein relate generally to data storage, and particularly to methods and systems for positioning read thresholds for minimizing bit error rate, based on successful decoding.

BACKGROUND

In various types of nonvolatile memories, data is stored in multiple predefined programming levels. Reading data from the memory typically involves setting read thresholds between pairs of nominal programming levels.

Methods for determining the positions of read thresholds are known in the art. For example, U.S. Pat. No. 9,318,215 describes a data storage device that includes non-volatile memory and a controller. The controller is configured to read first data from the non-volatile memory. The first data indicates a first count of storage elements of the group that have a first activation status when sensed with a first reference voltage at a first time. The controller is configured to read second data from the non-volatile memory. The second data indicates a second count of storage elements of the group that have the first activation status when sensed with the first reference voltage at a second time. The controller is configured to generate an updated first reference voltage at least partially based on a difference between the first count and the second count and based on one or more parameters corresponding to a distribution of threshold voltages of storage elements at the first time.

U.S. Pat. No. 8,482,978 describes a method for data storage, the method includes storing data in a group of analog memory cells by writing into the memory cells in the group respective storage values, which program each of the analog memory cells to a respective programming state selected from a predefined set of programming states, including at least first and second programming states, which are applied respectively to first and second subsets of the memory cells, whereby the storage values held in the memory cells in the first and second subsets are distributed in accordance with respective first and second distributions. A first median of the first distribution is estimated, and a read threshold, which differentiates between the first and second programming states, is calculated based on the estimated first median. The data is retrieved from the analog memory cells in the group by reading the storage values using the calculated read threshold.

SUMMARY

An embodiment that is described herein provides a memory controller that includes an interface and a processor. The interface is configured to communicate with a plurality of memory cells, and an individual one of the plurality of memory cells is configured to store data in multiple predefined programming levels. The processor is configured to read an Error Correction Code (ECC) code word from a group of multiple memory cells, via the interface, using multiple read thresholds positioned between adjacent programming levels, to produce multiple respective readouts that contain respective numbers of errors, to derive from the ECC code word a reference decoded readout that contains no errors, or contains one or more errors whose number is smaller than a number of errors in the ECC code word, to calculate multiple distances between the reference decoded readout and the respective readouts, and set a preferred read threshold based on the calculated distances, and to perform subsequent read operations for retrieving data from the plurality of memory cells, using the preferred read threshold.

In some embodiments, the processor is configured to set the preferred read threshold to be a read threshold among the multiple read thresholds for which a corresponding readout has a minimal distance from the decoded reference readout among the multiple readouts. In other embodiments, the processor is configured to set the preferred read threshold between two adjacent read thresholds among the multiple read thresholds. In yet other embodiments, the processor is configured to determine a mid-threshold located between adjacent programming levels, so that a ratio between respective numbers of the memory cells whose threshold voltages are above and below the mid-threshold differs from a predefined ratio by up to a predefined ratio deviation, and to position the multiple read thresholds in a predefined range of threshold voltages above and below the mid-threshold.

In an embodiment, the processor is configured to estimate, based on the multiple readouts, soft metrics for decoding the ECC code word. In another embodiment, the processor is configured to perform two or more decoding iterations for enhancing the soft metrics to increase a probability of successful decoding of the ECC code word. In yet another embodiment, the processor is configured to produce the soft metrics by estimating Gaussian models corresponding to voltage distributions of the adjacent programming levels, and to derive the soft metrics from the estimated Gaussian models.

In some embodiments, in a given decoding iteration, the processor is configured to use a resulting decoded code word of a previous decoding iteration for updating the Gaussian models in the given decoding iteration. In other embodiments, the processor is configured to calculate a number of errors in a given readout by counting a number of bit-differences between the given readout and a reference decoded readout that contains no errors.

There is additionally provided, in accordance with an embodiment that is described herein, a method for data storage, including, in a memory controller that communicates with a plurality of memory cells, and an individual one of the plurality of memory cells stores data in multiple predefined programming levels, reading an Error Correction Code (ECC) code word from a group of multiple memory cells, via the interface, using multiple read thresholds positioned between adjacent programming levels, to produce multiple respective readouts that contain respective numbers of errors. A reference decoded readout is derived from the ECC code word, the reference decoded readout contains no errors, or contains one or more errors whose number is smaller than a number of errors in the ECC code word. Multiple distances between the reference decoded readout and the respective readouts are calculated, and a preferred read threshold is set based on the calculated distances. Subsequent read operations are performed for retrieving data from the plurality of memory cells, using the preferred read threshold.

There is additionally provided, in accordance with an embodiment that is described herein, a memory system that includes a nonvolatile memory and a memory controller. The nonvolatile memory includes a plurality of memory cells, and an individual one of the plurality of memory cells is configured to store data in multiple predefined programming levels. The memory controller is configured to read an Error Correction Code (ECC) code word from a group of multiple memory cells, via the interface, using multiple read thresholds positioned between adjacent programming levels, for producing multiple respective readouts that contain respective numbers of errors, to derive from the ECC code word a reference decoded readout that contains no errors, or contains one or more errors whose number is smaller than a number of errors in the ECC code word, to calculate multiple distances between the reference decoded readout and the respective readouts, and set a preferred read threshold based on the calculated distances, and to perform subsequent read operations for retrieving data from the plurality of memory cells, using the preferred read threshold.

These and other embodiments will be more fully understood from the following detailed description of the embodiments thereof, taken together with the drawings in which:

DETAILED DESCRIPTION OF EMBODIMENTS

Overview

Figure 1:
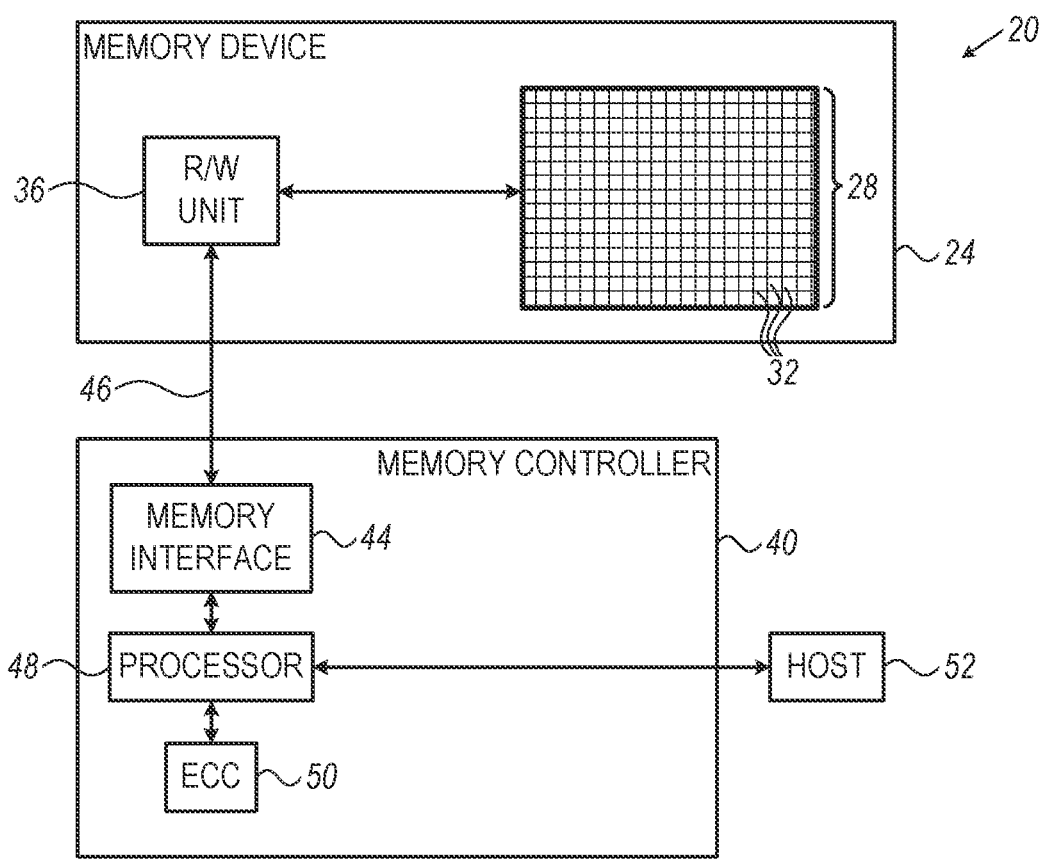
FIG. 1 is a block diagram that schematically illustrates a memory system, in accordance with an embodiment that is described herein.

Embodiments that are described herein provide improved methods and systems for positioning read thresholds for minimizing bit error rate in data retrieved from a memory device.

In various types of nonvolatile memory, data is stored in memory cells that each can be programmed to one of multiple programming levels. Reading the memory cells typically involves setting read thresholds for sensing the programming levels to which the memory cells are programmed. The read thresholds are positioned between adjacent programming levels.

The threshold voltages of memory cells that were programmed to a common programming level are associated with a corresponding voltage distribution. Distributions that are associated with respective (e.g., adjacent) programming levels may partially overlap one another. In such cases, a memory cell that was programmed to one programming level may be erroneously read as programmed to the other programming level. Consequently, accurate positioning of read thresholds between adjacent programming levels may be critical for achieving minimal bit error rate.

A memory system may include a memory controller that handles data programming and retrieval from a memory device. Consider a memory controller, that includes an interface and a processor. The interface communicates with a plurality of memory cells, wherein an individual one of the plurality of memory cells store data in multiple predefined programming levels. The processor is configured to read an Error Correction Code (ECC) code word from a group of multiple memory cells, via the interface, using multiple read thresholds positioned between adjacent programming levels, to produce multiple respective readouts that contain respective numbers of errors, and to derive from the ECC code word a reference decoded readout that contains no errors. Alternatively, the reference decoded readout contains one or more errors whose number is smaller than a number of errors in the ECC code word. The processor is further configured to calculate multiple distances between the reference decoded readout and the respective readouts, and to set a preferred read threshold based on the calculated distances. The processor is further configured to perform subsequent read operations for retrieving data from the plurality of memory cells, using the preferred read threshold.

In the present context and in the claims, the term "distance" refers to the number of bit-differences between two vectors of binary values. For example, the distance between the reference decoded readout and a given readout is specified by the number of bit-differences between the reference decoded readout and the given readout. A zero distance means that the reference decoded readout and the given readout are bit-wise equal.

In one embodiment, the processor sets the preferred read threshold to be one of the multiple read thresholds for which the corresponding readout has a minimal distance from the reference decoded readout among the multiple readouts. In another embodiment, the processor sets the preferred read threshold between two adjacent read thresholds among the multiple read thresholds. The processor may calculate the distance of a given readout from the reference decoded readout, e.g., by counting the number of bit-differences between the given readout and the reference decoded readout.

The processor may set the multiple read thresholds using any suitable method. In an example embodiment, the processor determines an initial mid-threshold located between adjacent programming levels, so that a ratio between respective numbers of the memory cells whose threshold voltages are above and below the mid-threshold differs from a predefined ratio by up to a predefined ratio deviation. The processor positions the multiple read thresholds in a predefined range of threshold voltages above and below the mid-threshold.

The position of the initial mid-threshold is typically insufficiently accurate for achieving the required bit error rate. To improve the accuracy in positioning the preferred read threshold, an error free reference readout is produced, and used for evaluating the distances from (or the numbers of errors in) the multiple respective readouts. As noted, the processor uses the distances (or the numbers of errors when the reference readout is error free) to determine the position of the preferred read threshold with high accuracy. In alternative embodiments, the reference readout may contain one or more errors, whose number is smaller than the number of errors in the ECC code word.

In some embodiments, the processor decodes the ECC using a suitable soft decoding method. To this end, the processor estimates soft metrics, based on the multiple readouts. The processor may estimate the soft metrics using any suitable method, e.g., by estimating voltage distributions of the adjacent programming levels and deriving the soft metrics from the estimated distributions. The voltage distributions may be modeled, for example, using Gaussian distributions.

In some cases, decoding of the ECC code word fails, and the processor applies one or more additional decoding iterations. In an embodiment, the processor performs two or more decoding iterations for enhancing the soft metrics, which in turn increases the probability of successful decoding of the ECC code word. In a given decoding iteration, the processor uses the resulting decoded code word of the previous decoding iteration for producing updated Gaussian distributions in the given decoding iteration.

In the disclosed techniques, a position of a read threshold is determined for achieving a low bit error rate. In some embodiments, determining the position of the read threshold is based on accurate counting of numbers of errors in multiple respective readouts, using an error free reference readout. To produce the error free readout, a high-performance decoding scheme may be required, such as an iterative decoding scheme with a hard decision feedback. The position of the read threshold is typically determined for a selected word line and may be used in reading data from the selected word line as well as from other word lines, e.g., in the same memory block.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 includes a memory device 24, which stores data in a memory array 28 that includes multiple memory cells 32, such as analog memory cells. In the context of the present patent application, the term "analog memory cell" is used to describe any memory cell that holds a continuous, analog value of a physical parameter, such as an electrical voltage or charge. Memory array 28 may include solid-state memory cells 32 of any kind, such as, for example, NAND, NOR and Charge Trap Flash (CTF) Flash cells, phase change RAM (PRAM, also referred to as Phase Change Memory-PCM), Nitride Read Only Memory (NROM), Ferroelectric RAM (FRAM) or Resistive RAM (RRAM). Although the embodiments described herein refer mainly to analog memory, the disclosed techniques may also be used with various other memory types.

The charge levels stored in the memory cells and/or the analog voltages or currents written into and read out of the memory cells are referred to herein collectively as analog values, storage values or analog storage values. Although the embodiments described herein mainly address threshold voltages, the methods and systems described herein may be used with any other suitable kind of storage values.

Note that in the description that follows, the terms "analog values" and "threshold voltages" are used interchangeably.

Memory system 20 stores data in analog memory cells 32 by programming the memory cells to assume respective memory states, which are also referred to as programming levels. The programming levels are selected from a finite set of possible levels, and each programming level corresponds to a certain nominal storage value. For example, a 2 bit/cell Multi-Level Cell (MLC) can be programmed to assume one of four possible programming levels by writing one of four possible nominal storage values into the cell. Similarly, a 3 bit/cell MLC, also referred to as a Triple-Level Cell (TLC), and a 4 bit/cell MLC, also referred to as a Quad-Level Cell (QLC) device can be respectively programmed to assume one of eight possible programming levels and one of sixteen programming levels. A memory cell that stores a single bit (i.e., using two programming levels) is also referred to as a Single-Level Cell (SLC).

Memory device 24 includes a reading/writing (R/W) module 36, which converts data for storage in the memory device to analog storage values and writes them into memory cells 32. In alternative embodiments, the R/W module does not perform the conversion, but is provided with voltage samples, i.e., with the storage values for storage in the cells. When reading data out of memory array 28, R/W module 36 converts the storage values of memory cells 32 into digital samples having an integer resolution of one or more bits. Data is typically written to and read from the memory cells in data units that are referred to as data pages (or simply pages, for brevity).

For reading a data page, the R/W module typically sets one or more read thresholds, e.g., at about mid-points between adjacent nominal programming levels, and senses the threshold voltages of the memory cells relative to the read thresholds. The R/W module can also read the analog values of the memory cells in selected ranges or zones by setting the read thresholds to zone boundaries.

The storage and retrieval of data in and out of memory device 24 is performed by a memory controller 40. Memory controller 40 includes a memory interface 44 for communicating with memory device 24, a processor 48, and an Error Correction Code (ECC) module 50. The memory controller communicates with the memory device via memory interface 44 over a communication link 46. Communication link 46 may include any suitable link or communication bus, such as, for example, a PCIe bus. The disclosed techniques can be carried out by memory controller 40, by R/W module 36, or both. Thus, in the present context, memory controller 40 and R/W module 36 are referred to collectively as storage circuitry that carries out the disclosed techniques.

Memory controller 40 communicates with a host 52, for accepting data for storage in the memory device and for outputting data retrieved from the memory device. In some embodiments, ECC module 50 encodes the data for storage using a suitable ECC and decodes the ECC of data retrieved from the memory. ECC module 50 may include any suitable type of ECC, such as, for example, Low Density Parity Check (LDPC), Reed-Solomon (RS) or Bose-Chaudhuri-Hocquenghem (BCH), can be used. It should be noted, however, that embodiments that are described below that rely on calculating a syndrome weight refer mainly to codes that can be represented by a set of parity-check equations such as, for example, LDPC codes. Moreover, a good approximation of the number of errors from the syndrome weight is achieved for codes having a sparse parity-check matrix, such as, for example, LDPC codes.

Data read from a group of memory cells may contain one or more errors. The number of errors typically increases when the read threshold used for sensing the memory cells is positioned non-optimally. In some applications, the ECC supported by ECC module 50 can be represented by multiple parity-check equations.

In an embodiment, a syndrome vector that is indicative of the error pattern is generated by multiplying the readout data vector by the parity-check matrix of the ECC, e.g., using a hardware matrix-by-vector multiplier (not shown). Alternatively, other suitable methods for producing the syndrome vector can also be used. The weight of the syndrome vector, i.e., the number of the non-zero elements in the syndrome vector equals the number of unsatisfied parity-check equations. When the number of errors is relatively small, the syndrome weight is indicative of the number of errors in the code word. For example, for a code word having 4K bytes, and assuming the code rate equals 0.9, a valid number of errors may be estimated from the syndrome weight up to about 700 errors or less. In an embodiment, the syndrome vector includes binary elements, and the syndrome weight is calculated by summing the binary elements having a "1" value.

Memory controller 40 may be implemented in hardware, e.g., using one or more Application-Specific Integrated Circuits (ASICs) or Field-Programmable Gate Arrays (FPGAs). Alternatively, the memory controller may include a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a Redundant Array of Independent Disks (PAID) storage system. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, processor 48 of memory controller 40 includes a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of memory array 28, memory cells 32 are arranged in multiple rows and columns, and each memory cell includes a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Data pages may be mapped to word lines in various manners. Each word line may store one or more data pages. A given data page may be stored in all the memory cells of a word line, or in a subset of the memory cells (e.g., the odd-order or even-order memory cells). To access a specific word line or data page, the memory device is provided with a respective physical address.

Erasing of the memory cells in memory array 28 is usually carried out in blocks that contain multiple memory pages. Typical memory devices may include thousands of erasure blocks (also referred to as "memory blocks"). In a typical two-dimensional (2D) two-bit-per-cell MLC device, each erasure block is on the order of 128 word lines, each including several tens of thousands of memory cells. Two-bit-per-cell devices having 128 word lines per erasure block that store a data page per bit significance value would have 256 data pages per erasure block, and three-bit-per-cell devices would have 394 data pages per block. A typical three-dimensional (3D) device that stores three bits per cell may include, for example, 4 sections per block, wherein each section includes several thousand strings that each includes 48 layers of cell columns. Such a 3D device has 12 data pages per a physical word line, or 576 data pages per an erasure block. Alternatively, other block sizes and configurations can also be used.

Methods for Determining an Accurate Read Threshold

Figure 2:
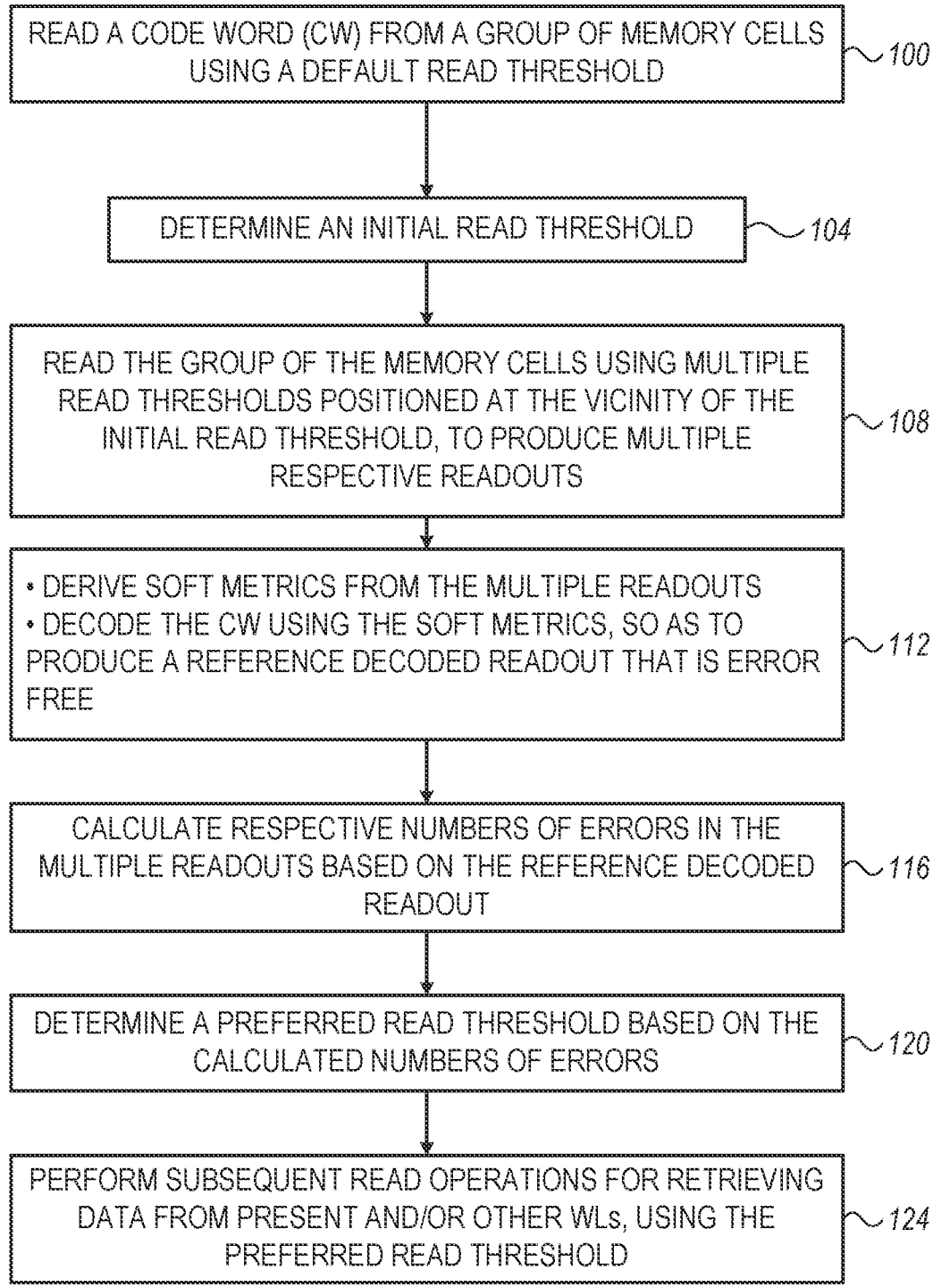
FIG. 2 is a flow chart that schematically illustrates a method for determining a read threshold for achieving a low bit error rate, in accordance with an embodiment that is described herein.

FIG. 2 is a flow chart that schematically illustrates a method for determining a read threshold for achieving a low bit error rate, in accordance with an embodiment that is described herein.

The method will be described as executed by processor 48 of memory controller 40. It is assumed that the required read threshold separates between a selected pair of adjacent programming levels.

The method begins with processor 48 reading a Code Word (CW) from a group of multiple memory cells (that belong to a common WL) using a predefined default read threshold, at a CW reading stage 100. Typically, the CW contains multiple bits that are read from multiple respective memory cells of the common WL. The CW may correspond to any suitable ECC, such as, for example, a LDPC code.

At an initial read threshold determination stage 104, processor 48 determines an initial read threshold using any suitable method. In the present example, when the initial read threshold is at about the middle of the threshold voltage axis, the processor determines the initial read threshold by checking a criterion according to which threshold voltages of the memory cells in the group are divided evenly (or within a predefined allowed ratio deviation) above and below that read threshold. More generally, the criterion specifies a predefined ratio between memory cells whose threshold voltages are above and below that threshold, and the initial read threshold is positioned so that the actual ratio differs from the predefined ratio by up to a predefined ratio deviation. In memory devices that store data in more than two programming levels, the initial read threshold is determined based on a subset of the memory cells in the group whose threshold voltages belong to the relevant adjacent programming levels.

In an example embodiment, processor 48 determines the initial read threshold using a binary-search approach. To this end, the processor re-selects candidate read thresholds within progressively narrowed ranges of threshold voltages, until identifying a candidate read threshold for which the criterion is met.

At a multi-sampling stage 108, processor 48 reads the memory cells in the group using multiple read thresholds that are positioned at the vicinity of the initial read threshold, to produce multiple respective readouts. In some embodiments, the multiple read thresholds are positioned apart from one another at a common interval of threshold voltages. The range of threshold voltages between adjacent read thresholds is also referred to as a "zone."

In the present example, it is assumed that soft decoding is required for successful decoding of the CW of stage 100. At a soft information producing stage 112, processor 48 derives soft metrics from the multiple readouts. The soft metrics may include any suitable type of soft metrics, such as, for example, Log-Likelihood Ratios (LLRs).

Further at stage 112, processor 48 applies to the CW of stage 100 a soft decoding scheme using the soft metrics. In an example embodiment, the processor assigns dedicated soft metrics to memory cells whose threshold voltages fall in respective zones. The outcome of the decoding operation at stage 112 includes a decoded CW that contains no errors. This decoded CW is also referred to herein as a "reference decoded readout."

As will be described in detail below, in order to increase the probability of successful decoding that results in an error free decoded CW, an iterative decoding scheme may be used. Example iterative decoding schemes are described with reference to FIG. 4 and FIG. 5 below.

At an error-count evaluation stage 116, processor 48 calculates respective numbers of errors in the multiple readouts, based on the reference decoded readout. Since the reference decoded readout contains no errors, the processor may correctly evaluate the number of errors in a given readout by counting the number of bit-differences between the reference decoded readout and the given readout. For example, in an embodiment, the processor performs a bit-wise logical XOR operation between the reference decoded readout and the given readout, and counts the number of '1' bits in the outcome of the bitwise logical XOR operation.

At a read threshold determination stage 120, processor 48 determines a preferred read threshold based on the numbers of errors evaluated at stage 116. The processor selects a preferred read threshold that is expected to result in a minimal (or close to minimal) error rate in reading data from the present and/or other word lines. Methods for determining a preferred read threshold based on the numbers of errors will be described in detail with reference to FIG. 3.

At a data retrieval stage 124, processor 48 performs read operations to retrieve data from the present and/or other WLs in the memory device, using the preferred read threshold. Following stage 124 the method terminates.

In the method of FIG. 2 it is assumed that decoding the CW succeeds. In some embodiments, when decoding the CW fails, e.g., after running a predefined maximal number of decoding iterations, the method terminates, and the processor may responsively issue a failure indication.

Methods for Accurate Positioning of a Preferred Read Threshold

Figure 3:
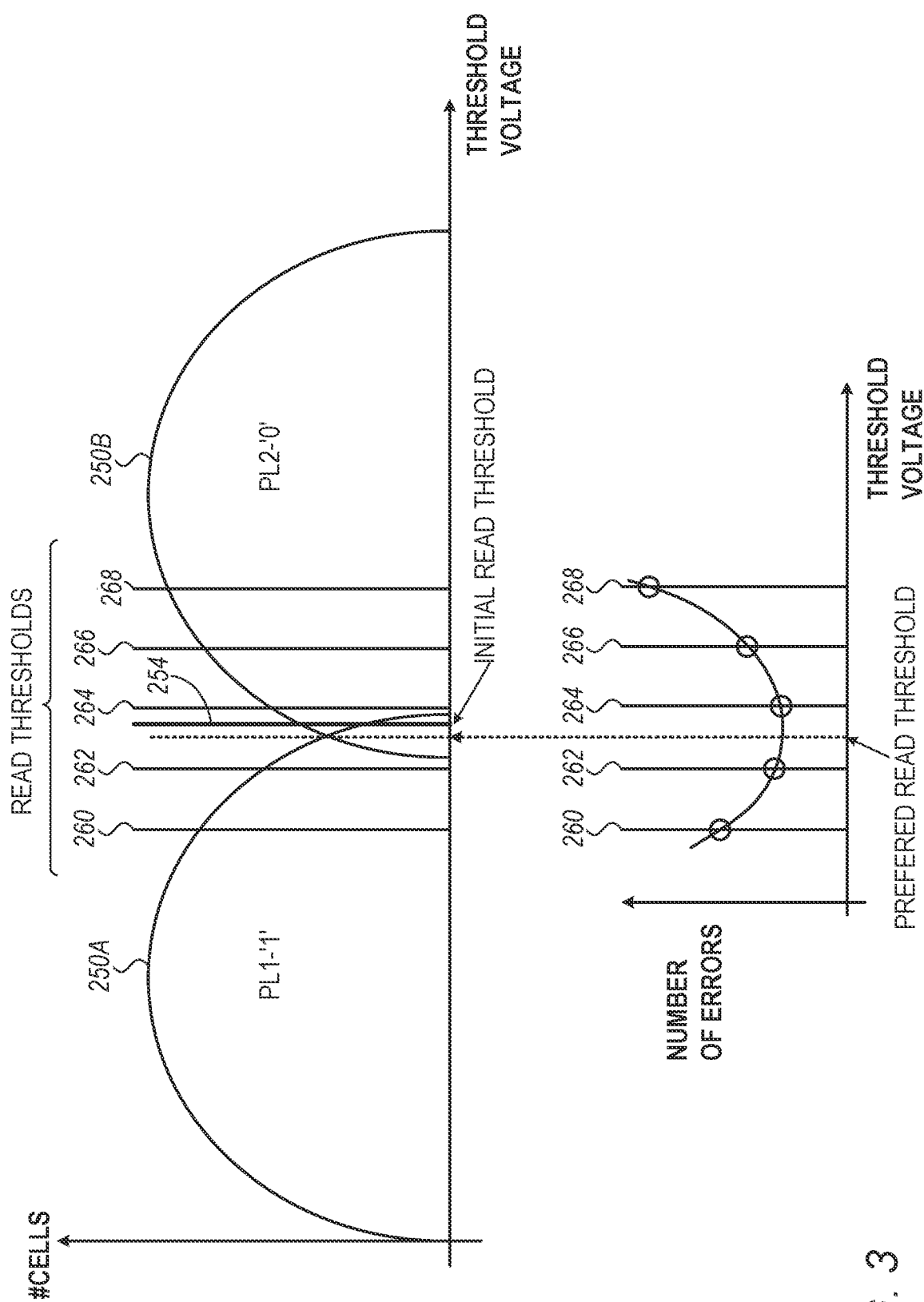
FIG. 3 is a diagram that schematically illustrates a method for accurate positioning of a read threshold, in accordance with an embodiment that is described herein.

FIG. 3 is a diagram that schematically illustrates a method for accurate positioning of a read threshold, in accordance with an embodiment that is described herein.

The method will be described as executed by processor 48 of memory controller 40.

The upper part of the FIG. 3 depicts voltage distributions 250A and 250B, associated respectively with adjacent programming levels denoted PL1 and PL2. The figure also depicts an initial read threshold 254, and multiple additional read thresholds 260 . . . 268. Processor 48 may determine the position of the initial read threshold, as described at stage 104 of the method of FIG. 2 or using any other suitable method. Although in the present example five additional read thresholds are used, other suitable numbers of the additional read thresholds can also be used, e.g., between 10 and 20.

In some embodiments, processor 48 sets the additional read thresholds (260 . . . 268) in the vicinity of initial read threshold 254, e.g., above and below the initial read threshold. In the present example, a middle read threshold 264 among read thresholds 260 . . . 268 is different from initial read threshold 254. Alternatively, the processor may position the middle read threshold at the same position of the initial read threshold. The processor reads the memory cells in the group using the multiple read thresholds (260 . . . 268) to produce multiple respective readouts (not shown).

The lower part of FIG. 3 depicts the number of errors in the multiple readouts. The numbers of errors are depicted as respective points on the vertical lines of read thresholds 260 . . . 268. As seen in the figure, the number of errors typically increases with the distance of the underlying read threshold from the preferred read threshold.

Processor 48 may determine the position of the preferred read threshold in various ways. In one embodiment, the processor fits to the points in the diagram a suitable function, such as a polynomial function, based on some or all of the points representing the numbers of errors, and sets the preferred read threshold to a point along the threshold voltage axis for which the function gets a minimal value. In another embodiment, the processor fits a parabolic function to three points corresponding to the smallest number of errors, and sets the preferred read threshold to a threshold voltage at which the parabolic function gets a minimal value.

In yet another embodiment, the processor scans some or all the points corresponding to the number of errors, in any suitable order, and selects a preferred read threshold among the multiple read thresholds (260 . . . 268) for which the number of errors is minimal. The processor may efficiently identify the readout having the minimal number of errors, e.g., by applying to the points a binary search method.

Methods for Improved Decoding

As noted above, the method of FIG. 2 relies on successful decoding of the CW to produce an error free reference decoded readout. Improved decoding capability may be achieved by using a soft decoding scheme, using predefined soft metrics (e.g., LLRs). In some embodiments, however, using predefined soft metrics may be insufficient for successful decoding, e.g., under adverse conditions. In some disclosed embodiments, an iterative decoding scheme may be employed (e.g., in implementing stage 112 of FIG. 2) to increase the probability of successful decoding.

Figure 4:
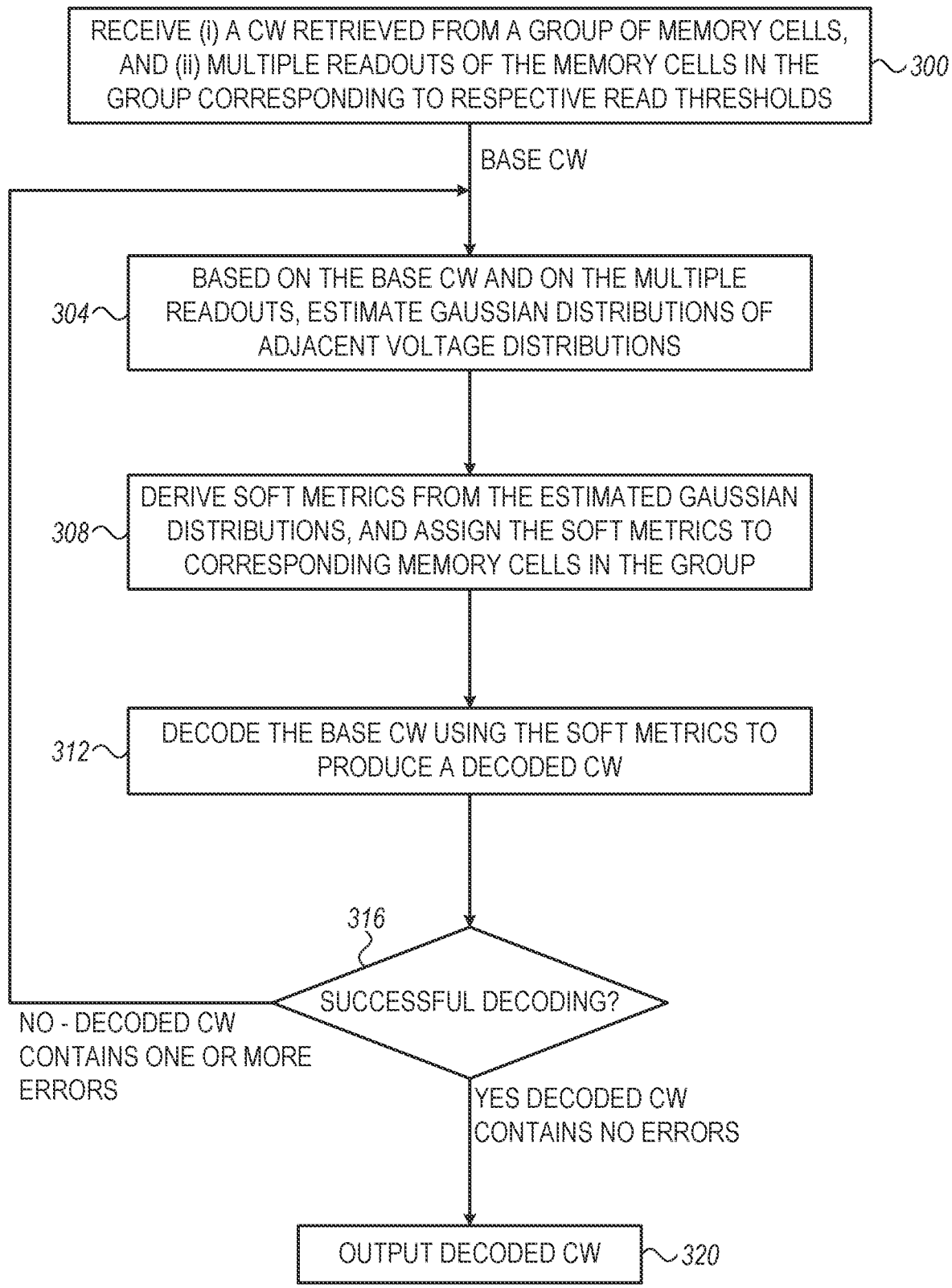
FIG. 4 is a flow chart that schematically illustrates a method for iterative decoding using hard decision feedback, in accordance with an embodiment that is described herein.

FIG. 4 is a flow chart that schematically illustrates a method for iterative decoding using hard decision feedback, in accordance with an embodiment that is described herein.

The method may be used in implementing stage 112 of the method of FIG. 2 above. The method will be described as executed by processor 48 of memory controller 40.

The method begins at a reception stage 300 by processor 48 receiving (i) a CW retrieved from a group of memory cells, and (ii) multiple readouts of the memory cells in the group corresponding to multiple respective read thresholds. The received CW also serves as an initial base CW that may be updated across decoding iterations, as will be described below.

At a distribution estimation step 304, processor 48 estimates the voltage distributions corresponding to adjacent programming levels, based on the base CW and on the multiple readouts. In the present example, the processor models the voltage distributions as Gaussian distributions. Alternatively, other suitable models of the voltage distributions can also be used. The processor estimates two Gaussian distributions for each pair of adjacent programming levels that have opposite bit encoding. For example, in reading the CW from a page of a certain bit-significance value (e.g., a LSB page), one of the adjacent programming levels encodes a '0' bit and the other encodes a '1' bit (as shown, for example, in FIG. 3 above).

At a soft information derivation stage 308, processor 48 derives soft metrics from the estimated Gaussian distributions, and assigns the soft metrics to corresponding memory cells in the group from which the code word has been read. This is equivalent to assigning the soft metrics to corresponding bits of the base CW. The processor typically derives separate soft metrics to be used in different zones of the threshold voltages between adjacent read thresholds. The processor additionally assigns soft metrics to memory cells in the group that are not in zones where adjacent voltage distributions may overlap. For example, the processor assigns soft metrics that are indicative of a high reliability to such memory cells.

At stage 308, the processor may estimate the Gaussian distributions and derive the soft metrics using any suitable methods, such as methods described, for example, in U.S. Pat. No. 10,884,855.

At a decoding stage 312, the processor decodes the ECC of the base CW by applying a suitable soft decoding scheme to the base CW, using the assigned soft metrics (e.g., using ECC 50 of FIG. 1). At a decoding status query stage 316, the processor checks whether the decoding at stage 312 has succeeded to produce an error free decoded CW, and if not, loops back to stage 304 to re-estimate the Gaussian distributions based on the decoded CW produced at step 312 serving as an updated base CW. Otherwise, the decoded CW contains no errors, and the processor outputs the decoded CW at an outputting stage 320. Following stage 320 the method terminates.

In a given decoding iteration, the decoded CW is expected to contain a smaller number of errors compared to the input base CW. Consequently, in the subsequent decoding iteration that uses the decoded CW as an updated base CW, the estimation of the Gaussian distributions is expected to improve, which results in enhanced LLRs, and therefore in increasing the probability of successful decoding. The iterative decoding continues until converging to an error free decoded CW, or until a predefined maximal limit number of decoding iterations has been reached.

Figure 5:
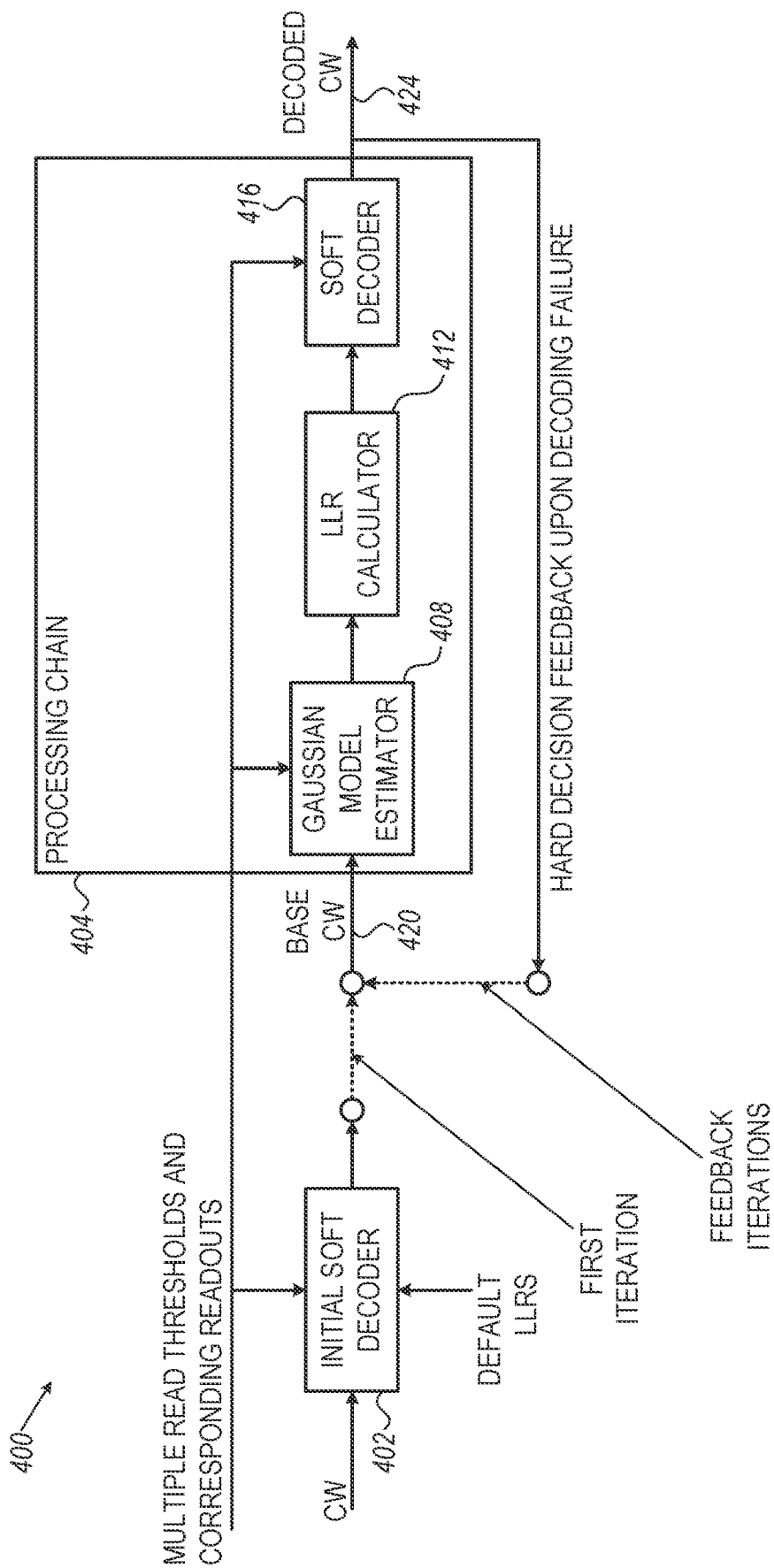
FIG. 5 is a block diagram that schematically illustrate a decoding scheme that employs iterative decoding, in accordance with an embodiment that is described herein.

FIG. 5 is a block diagram 400 that schematically illustrate a decoding scheme that employs iterative decoding, in accordance with an embodiment that is described herein.

The decoding scheme of FIG. 5 may be used, for example, in implementing stage 112 of the method in FIG. 2 above. In describing the method, it is assumed that Log-Likelihood Ratio (LLR) soft metrics are used for soft decoding. Alternatively, other suitable soft metrics can also be used.

In FIG. 5, an initial decoder 402 that receives as an input CW to be decoded. In the present example the initial decoder includes a soft decoder that uses predefined default LLRs (e.g., specified in a pre-stored table). The initial decoder further receives multiple read thresholds and corresponding readouts of the group of memory cells from which the CW has been retrieved, taken at multiple respective read thresholds. The read thresholds define zones of threshold voltages, in which separate LLRs are assigned to memory cells whose threshold voltages fall within the zones.

Initial decoder 402 assigns the default LLRs to the memory cells from which the CW was retrieved and applies a suitable soft decoding scheme to the input CW using the assigned LLRs. In the present example, it is assumed that the default LLRs are insufficiently accurate and therefore the initial decoding fails. This means that the output of the initial decoder includes the original CW (that was stored) with one or more erroneous bits. The output of initial decoder 402 is subjected to further processing as described herein.

The further processing is carried out using a processing chain 404 that includes a Gaussian model estimator 408, a LLR calculator 412 that calculates LLRs based on Gaussian models produced by the Gaussian model estimator, and another soft decoder 416 that performs soft decoding using the calculated LLRs. The CW input to processing chain 404 is also referred to herein as a "base CW" 420, and the output of soft decoder 416 is also referred to herein as a "decoded CW" 424.

In a first decoding iteration, bas CW 420 includes the decoded output of initial decoder 402. When soft decoder 416 fails, decoded CW 424 (hard decision) is fed back to the input of the processing chain to serve as an updated base CW. The processing chain is applied iteratively until decoded CW 424 contains no errors (or until exceeding a predefined number of decoding iterations with no convergence to an error free decoded CW).

In the first decoding iteration that uses the processing chain, LLR calculator 412 produces LLRs based on estimated Gaussian models of the voltage distributions, and are therefore typically more accurate than the default LLRs used by the initial decoder. Consequently, in the first iteration, decoded CW 424 contains less errors than the input base CW. In the second iteration, since the base CW contains less errors compared to the first iteration, the Gaussian model estimator produces improved Gaussian models, which in turn result in enhanced LLRs. As a result, the number of errors in decoded CW 424 reduces after the second iteration compared to the first iteration.

Subsequent iterations similarly result in reduction of the number of errors in decoded CW 424. The decoding iterations terminate when detecting that decoded code word 424 contains no errors.

The decoding scheme in FIG. 5 is given by way of example, and other suitable decoding schemes can also be used. For example, although in the embodiments described above initial decoder 402 performs soft decoding, in alternative embodiments the initial decoder may decode the input CW using any suitable hard decoding scheme. In yet other embodiments, initial decoder 420 may be omitted, in which case the input CW serves as a base CW for the first decoding iteration.

The embodiments described above are given by way of example, and other suitable embodiments can also be used. For example, although embodiments described above refer mainly to voltage distributions of two adjacent programming levels, the disclosed embodiments are also applicable, mutatis mutandis, to memory devices that store data in more than two programming levels.

In the embodiments described above, it was mainly assumed that the reference decoded readout contains no errors. In this case the number of errors of a given readout equals the distance of that given readout from the reference decoded readout. This also means that finding a preferred read threshold that minimizes the number of errors is equivalent to finding the preferred readout by minimizing the distance relative to the reference decoded readout that has no errors. In alternative embodiments, the reference decoded readout may contain one or more errors (e.g., whose number is smaller than the number of errors in the code word read from the group of the memory cells). This may occur, for example, when the iterative decoding is early terminated to reduce decoding latency. In these alternative embodiments, the preferred read threshold may not minimize the number of errors.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A memory controller, comprising:
an interface, configured to communicate with a plurality of memory cells, wherein an individual one of the plurality of memory cells is configured to store data in multiple predefined programming levels; and
a processor configured to:
read an Error Correction Code (ECC) code word from a group of multiple memory cells, via the interface, using a default read threshold positioned between adjacent programming levels;
read the group of the multiple memory cells using multiple read thresholds positioned between the adjacent programming levels to produce multiple respective readouts that contain respective numbers of errors;
derive a reference decoded readout from the ECC code word that was read using the default read threshold;
calculate multiple distances specifying numbers of bit-differences between the reference decoded readout and the respective readouts, and set a preferred read threshold based on the calculated distances; and
perform subsequent read operations for retrieving data from the plurality of memory cells, using the preferred read threshold.

2. The memory controller according to claim 1, wherein the processor is configured to set the preferred read threshold to be a read threshold among the multiple read thresholds for which a corresponding readout has a minimal distance from the decoded reference readout among the multiple readouts.

3. The memory controller according to claim 1, wherein the processor is configured to set the preferred read threshold between two adjacent read thresholds among the multiple read thresholds.

4. The memory controller according to claim 1, wherein the processor is configured to determine a mid-threshold located between the adjacent programming levels, so that a ratio between respective numbers of the memory cells whose threshold voltages are above and below the mid-threshold differs from a predefined ratio by up to a predefined ratio deviation, and to position the multiple read thresholds in a predefined range of threshold voltages above and below the mid-threshold.

5. The memory controller according to claim 1, wherein the processor is configured to estimate, based on the multiple readouts, soft metrics for decoding the ECC code word.

6. The memory controller according to claim 5, wherein the processor is configured to perform two or more decoding iterations for enhancing the soft metrics to increase a probability of successful decoding of the ECC code word.

7. The memory controller according to claim 5, wherein the processor is configured to produce the soft metrics by estimating Gaussian models corresponding to voltage distributions of the adjacent programming levels, and to derive the soft metrics from the estimated Gaussian models.

8. The memory controller according to claim 7, wherein in a given decoding iteration, the processor is configured to use a resulting decoded code word of a previous decoding iteration for updating the Gaussian models in the given decoding iteration.

9. The memory controller according to claim 1, wherein the reference decoded readout contains no errors, and wherein the processor is configured to calculate a given distance between a given readout and the reference decoded readout as a number of errors in the given readout by counting a number of bit-differences between the given readout and the reference decoded readout.

10. A method for data storage, comprising:
in a memory controller that communicates with a plurality of memory cells, wherein an individual one of the plurality of memory cells is configured to store data in multiple predefined programming levels,
reading an Error Correction Code (ECC) code word from a group of multiple memory cells using a default read threshold positioned between adjacent programming levels;
reading the group of the multiple memory cells using multiple read thresholds positioned between the adjacent programming levels to produce multiple respective readouts that contain respective numbers of errors;
deriving a reference decoded readout from the ECC code word that was read using the default read threshold;
calculating multiple distances that specify numbers of bit-differences between the reference decoded readout and the respective readouts, and setting a preferred read threshold based on the calculated distances; and
performing subsequent read operations for retrieving data from the plurality of memory cells, using the preferred read threshold.

11. The method according to claim 10, wherein setting the preferred read threshold comprises setting the preferred reads threshold to be a read threshold among the multiple read thresholds for which a corresponding readout has a minimal distance from the decoded reference readout among the multiple readouts.

12. The method according to claim 10, wherein setting the preferred read threshold comprises setting the preferred read threshold between two adjacent read thresholds among the multiple read thresholds.

13. The method according to claim 10, and comprising determining a mid-threshold located between the adjacent programming levels, so that a ratio between respective numbers of the memory cells whose threshold voltages are above and below the mid-threshold differs from a predefined ratio by up to a predefined ratio deviation, and positioning the multiple read thresholds in a predefined range of threshold voltages above and below the mid-threshold.

14. The method according to claim 10, wherein deriving the reference decoded readout comprises estimating, based on the multiple readouts, soft metrics for decoding the ECC code word.

15. The method according to claim 14, wherein deriving the reference decoded readout comprises performing two or more decoding iterations for enhancing the soft metrics to increase a probability of successful decoding of the ECC code word.

16. The method according to claim 14, wherein estimating the soft metrics comprises estimating Gaussian models corresponding to voltage distributions of the adjacent programming levels, and deriving the soft metrics from the estimated Gaussian models.

17. The method according to claim 16, deriving the reference decoded readout comprises, in a given decoding iteration using a resulting decoded code word of a previous decoding iteration for updating the Gaussian models in the given decoding iteration.

18. The method according to claim 10, wherein the reference decoded readout contains no errors, and comprising calculating a given distance between a given readout and the reference decoded readout as a number of errors in the given readout by counting a number of bit-differences between the given readout and the reference decoded readout.

19. A memory system, comprising:
a nonvolatile memory comprising a plurality of memory cells, wherein an individual one of the plurality of memory cells is configured to store data in multiple predefined programming levels; and
a memory controller configured to:
read an Error Correction Code (ECC) code word from a group of multiple memory cells using a default read threshold positioned between adjacent programming levels;
read the group of the multiple memory cells using multiple read thresholds positioned between the adjacent programming levels to produce multiple respective readouts that contain respective numbers of errors;
derive a reference decoded readout from the ECC code word that was read using the default read threshold;
calculate multiple distances specifying numbers of bit-differences between the reference decoded readout and the respective readouts, and set a preferred read threshold based on the calculated distances; and
perform subsequent read operations for retrieving data from the plurality of memory cells, using the preferred read threshold.

* * * * *